(12) United States Patent
Münch et al.

(10) Patent No.: US 6,312,962 B1
(45) Date of Patent: Nov. 6, 2001

(54) METHOD FOR COB MOUNTING OF ELECTRONIC CHIPS ON A CIRCUIT BOARD

(75) Inventors: Thomas Münch, Laaber; Jens Pohl, Bernhardswald; Oliver Wutz, Laaber, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/566,936

(22) Filed: May 8, 2000

(30) Foreign Application Priority Data

May 7, 1999 (DE) .............................. 199 21 113

(51) Int. Cl.[7] .............................. H01L 21/66; G01R 31/26
(52) U.S. Cl. .............................. 438/15; 438/14; 438/108; 438/118
(58) Field of Search .............................. 438/14, 15, 108, 438/118

(56) References Cited

U.S. PATENT DOCUMENTS 5,169,056 * 12/1992 Reele et al. ................... 228/180.2
5,182,853 * 2/1993 Kobayashi et al. ............. 29/841

* cited by examiner

*Primary Examiner*—John F. Niebling
*Assistant Examiner*—David A Zarneke
(74) *Attorney, Agent, or Firm*—Herbert L. Lerner; Laurence A. Greenberg; Werner H. Stemer

(57) ABSTRACT

A method for COB mounting of electronic chips on a circuit board includes contact connection of connecting wires and substantially whole-area adhesive bonding of a housing. A chip is partially adhesively bonded on a circuit board in such a way that the chip can be contact-connected and can be removed again without damage to the circuit board. Electronic tests or a burn-in process is performed on the chip. The chip, with a given functionality in a manner that is required for application of the circuit board, is fully adhesively bonding.

7 Claims, 2 Drawing Sheets

METHOD FOR COB MOUNTING OF ELECTRONIC CHIPS ON A CIRCUIT BOARD

BACKGROUND OF THE INVENTION

Field of the Invention

The invention relates to a method for COB mounting of electronic chips on a circuit board by contact connection of connecting wires and substantially whole-area adhesive bonding of a chip housing.

In a method for COB (Chip on Board) mounting, the electronic chips are fixed directly on a circuit board (PCB—Printed Circuit Board), subsequently contact-connected by bonding and finally enclosed by a covering compound. The COB method is used, inter alia, in the mounting of memory modules (SIMM, DIMM, etc.). In that case, generally two or more individual chips are mounted on a circuit board.

The method has the advantage of obviating following steps that are usually required, namely the mounting of chips which have already been provided with housings on the circuit board and the soldering of connections. However, the consequence thereof is that, in contrast to the conventional component-mounting methods, the chips can only be tested, or written to in the case of memory modules, in the completely mounted state. If such a chip is defective or fails, which is often not noticed until after an artificial aging process (so-called burn-in process), it is generally very difficult and costly to remove that chip again from the circuit board and replace it with a new specimen. Moreover, the circuit board and, in particular, the conductor tracks can be damaged as a result.

SUMMARY OF THE INVENTION

It is accordingly an object of the invention to provide a method for COB mounting of electronic chips on a circuit board, which overcomes the hereinafore-mentioned disadvantages of the heretofore-known methods of this general type and in which a risk of damage to the circuit board in the event of defective chips or modules being replaced is substantially reduced.

With the foregoing and other objects in view there is provided, in accordance with the invention, a method for COB mounting of electronic chips on a circuit board, which comprises partially adhesively bonding a chip on a circuit board for permitting the chip or the module to be contact-connected and removed again without damage to the circuit board; contact-connecting connecting wires between the chip and the circuit board; performing electronic tests or programmings on the chip or module; and fully adhesively bonding and encapsulating the chip with given functionality and substantially whole-area adhesively bonding a housing for the chip, in a manner required for use of the circuit board.

It has been shown, surprisingly, that if the housing is subject to partial adhesive bonding with a strength which suffices for contact connection, it is nevertheless possible in almost all cases to detach the chip or the module again from the circuit board without any damage.

In accordance with another mode of the invention, the adhesive is applied in particular in the form of tracks of adhesive along those edges of the chip at which the connecting wires of the chip are to be connected to the circuit board.

In accordance with a further mode of the invention, the adhesive for the partial adhesive bonding is preferably a thermoplastic adhesive tape or a UV adhesive tape which is ideally adhesive on both sides.

In accordance with a concomitant mode of the invention, the adhesive for the partial adhesive bonding or temporary adhesive bonding can be reused after removal of the chip.

Other features which are considered as characteristic for the invention are set forth in the appended claims.

Although the invention is illustrated and described herein as embodied in a method for COB mounting of electronic chips on a circuit board, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 3:
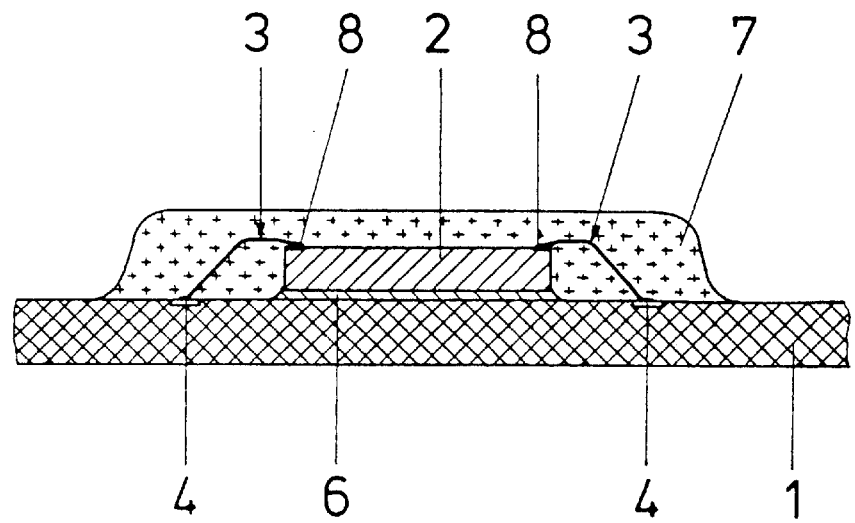
FIG. 3 is a fragmentary, cross-sectional view of part of the circuit board in a completed state.
Figure 4:
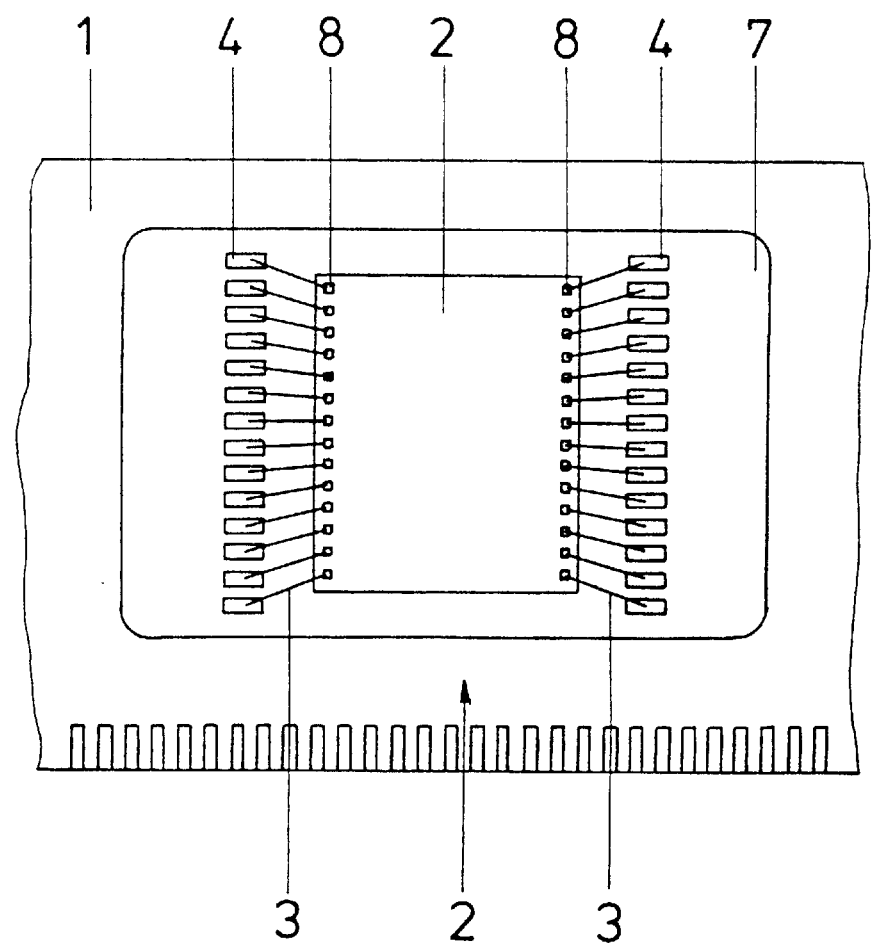
FIG. 4 is a fragmentary, plan view of the part of the circuit board shown in FIG. 3.

Referring now to the figures of the drawings in detail, it is seen that they each illustrate a circuit board 1 on which a chip 2 is mounted. In this case, the chip 2 is still "bare", that is to say without a housing, and includes, for example, merely a semiconductor chip, in particular a silicon chip, which has been separated from a wafer. Electrical contact between electronics integrated in the chip and the circuit board 1 is established by connecting wires 3 which are bonded onto contact pads 4 of the circuit board 1 and onto contact pads 8 of the chip 2. Tracks 5a, 5b of adhesive seen in FIGS. 1 and 2 serve to fix the chip 2. In order to conclude the method, the chip 2 is enclosed by a covering compound 7 seen in FIGS. 3 and 4. If the latter is too viscous to fully fill a cavity under the chip 2, that cavity is filled with a highly liquid "underfill material".

In detail, the method is carried out as follows: after the preparation of the circuit board 1 and of the chips 2, initially partial adhesive bonding is performed in a first mounting step. For this purpose, the tracks 5a, 5b of adhesive that are adhesive on both sides are adhesively bonded onto the underside of the chip in the region of the sides of the chip 2. The chip 2 is subsequently placed onto the circuit board 1. A sufficient minimum strength of the mounting of the chip 2 on the circuit board 1 is ensured by virtue of the configuration of the tracks 5a, 5b of adhesive in the region of the connecting wires 3, in order to subsequently enable contact connection (preferably bonding) of the connecting wires to the contact areas 4, for example by coupling-in ultrasonic power.

Initially, an expedient bonding process is made possible by virtue of the chip 2 being supported in the region of the contact pads 8 and, in addition, mechanical damage to the chip 2 as a result of possible bending loading on the chip 2 during wire bonding is avoided.

Depending on the specific conditions such as, for example, the flexibility of the circuit board and/or the size of the chip, a connection between a non-illustrated chip housing and the circuit board 1 can, of course, also be provided with a larger or smaller area (e.g. also in the form of a plurality of adhesive spots). However, it must be taken into account that an excessively large-area connection can make the removal of the chip more difficult.

The adhesive which is used may, for example, be a thermoplastic adhesive tape or a UV adhesive tape, in which an adhesive capability is obtained by irradiation with UV light. It would also be conceivable, of course, to use an adhesive which can be detached again by external action (radiation or the like), so that the chip could be demounted without mechanical force being applied.

In the case of memory modules, it is necessary, when choosing the adhesive, to take into account the fact that relatively high temperatures may occur due to a burn-in process, and the adhesive must not be detached as a result of such temperatures.

A further, particularly advantageous possibility is to provide an adhesive which can be reused, after the chip has been detached, for the mounting of a functional replacement chip. For this purpose, the material must have the lowest possible plastic deformation during the fixing of the chip. By way of example, a corresponding thermoplastic adhesive tape or a corresponding UV adhesive tape of the type mentioned above is also appropriate for this purpose. If the adhesive cannot be reused, it should at the very least be able to be removed from the circuit board easily and without leaving any residues.

Figure 1:
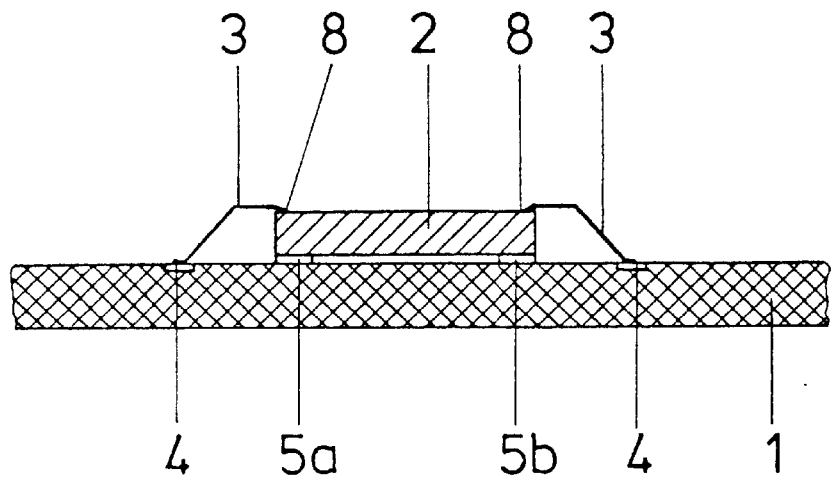
FIG. 1 is a fragmentary, diagrammatic, cross-sectional view of part of a circuit board during a method for COB mounting.
Figure 2:
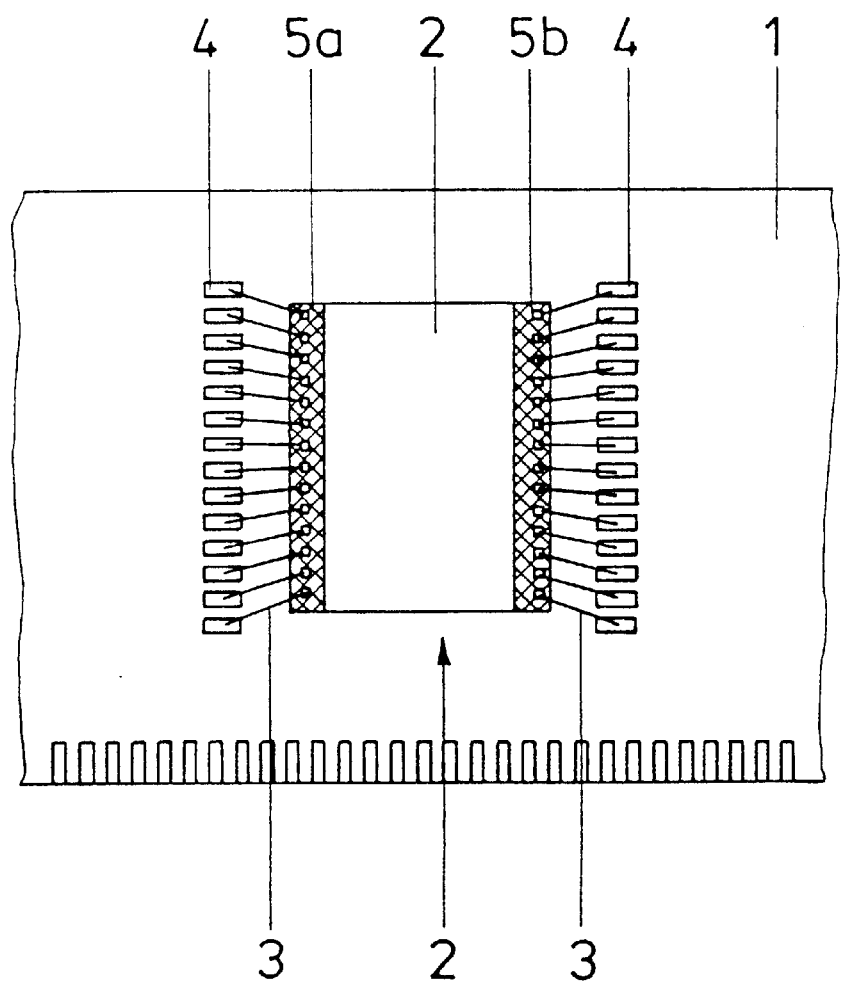
FIG. 2 is a fragmentary, plan view of the part of the circuit board shown in FIG. 1.

After the chip 2 has been provisionally fixed (partially adhesively bonded) on the circuit board 1 and contact-connected in accordance with FIGS. 1 and 2, the chip 2 can be tested and/or programmed or subjected to heat treatment. If the chip 2 is functional, the method is concluded in accordance with FIGS. 3 and 4. If the chip 2 is defective, it and the connecting wires 3 are removed and a new chip 2 is inserted and contact-connected instead.

In order to produce a final fixing, the cavity situated under the chip 2 is fully filled with an underfill material, thereby obtaining essentially whole-area adhesive bonding of the housing on the circuit board 1 with an adhesive layer 6. So-called underfill techniques are known for this purpose. The adhesive is an epoxy adhesive, for example. Finally, after curing, the covering compound 7 is applied, which completely surrounds the chip 2 and the connecting wires 3.

The above-mentioned underfill material can be dispensed with, provided that the covering compound 7 is sufficiently liquid and can enter the cavity between the circuit board 1 and the chip 2.

We claim:

1. A method for COB mounting of electronic chips on a circuit board, which comprises the following steps:

initially bonding a chip to a circuit board by applying only enough adhesive between an underside of the chip and the circuit board as to permit the chip to be contact-connected and yet to remain removable without damage to the circuit board;

contact-connecting connecting wires between the chip and the circuit board;

performing electronic tests or programmings on the chip; and subsequently bonding the chip to the circuit board by applying sufficient amount of adhesive as required for use of the circuit board.

2. The method according to claim 1, which further comprises carrying out the partial adhesive bonding step by regionally applying an adhesive to one of the chip and the circuit board.

3. The method according to claim 2, which further comprises carrying out the step of applying the adhesive in the form of tracks of adhesive along edges of the chip, attaching one end of the connecting wires to contact areas of the chip and connecting other ends of the connecting wires to contact areas of the circuit board.

4. The method according to claim 1, wherein the subsequent bonding step is carried out by adhesively bonding the chip by underfilling parts of the underside of the chip not adhesively bonded by the initial bonding step to the circuit board, with an adhesive layer.

5. The method according to claim 1, which further comprises carrying out the step of partially adhesively bonding the chip with a thermoplastic adhesive tape.

6. The method according to claim 1, which further comprises carrying out the step of partially adhesively bonding the chip with a UV adhesive tape.

7. The method according to claim 1, which further comprises carrying out the step of partially adhesively bonding the chip with an adhesive to be reused after removal of a chip for subsequent partial adhesive bonding of a replacement element.

* * * * *